(12) United States Patent
Su et al.

(10) Patent No.: US 6,579,408 B1
(45) Date of Patent: Jun. 17, 2003

(54) APPARATUS AND METHOD FOR ETCHING WAFER BACKSIDE

(75) Inventors: Hui Chi Su, Kaohsiung (TW); Song Tsang Chiang, Ju-Dong (TW)

(73) Assignee: Industrial Technology Research Institute, Hsin Chu (TW)

(*) Notice: Subject to any disclaimer, the term of this patent is extended or adjusted under 35 U.S.C. 154(b) by 0 days.

(21) Appl. No.: 10/127,389

(22) Filed: Apr. 22, 2002

(51) Int. Cl.⁷ ........................ H01L 21/306; C23C 16/00
(52) U.S. Cl. ................ 156/345.11; 156/345.1; 156/345.19; 156/345.23
(58) Field of Search ............... 156/345.1, 345.11, 156/345.19, 345.23

(56) References Cited

U.S. PATENT DOCUMENTS

| | | | | |
|---|---|---|---|---|
| 5,275,690 A | * | 1/1994 | Garwood, Jr. ............... | 216/92 |
| 5,324,410 A | * | 6/1994 | Kummer et al. ........ | 204/297.05 |
| 5,578,167 A | * | 11/1996 | Sooriakumar et al. ...... | 438/745 |
| 6,171,437 B1 | * | 1/2001 | Shimizu et al. ......... | 156/345.23 |

FOREIGN PATENT DOCUMENTS

| | | | | |
|---|---|---|---|---|
| JP | 63221627 A | * | 9/1988 | ......... H01L/21/306 |
| JP | 02089375 A | * | 3/1990 | ........... H01L/29/84 |
| JP | 04241419 A | * | 8/1992 | ......... H01L/21/306 |
| JP | 04291921 A | * | 10/1992 | ......... H01L/21/306 |
| JP | 2000058504 A | * | 2/2000 | ......... H01L/21/306 |
| JP | 2000091305 A | * | 3/2000 | ......... H01L/21/306 |
| JP | 2001053054 A | * | 2/2001 | ......... H01L/21/306 |

\* cited by examiner

*Primary Examiner*—Gregory Mills
*Assistant Examiner*—Ram N Kackar
(74) *Attorney, Agent, or Firm*—Randy W. Tung

(57) ABSTRACT

An apparatus and a method for mounting a wafer and etching a wafer backside in an etchant solution are provided. The apparatus is constructed by a first circular disc that has a first sidewall integrally formed, a gas inlet in the first circular disc or the first sidewall, a second circular disc that has a second sidewall integrally formed for positioning inside the first circular disc and forming a first cavity therein between, a third circular disc that has a third sidewall integrally formed for positioning inside the second circular disc and forming a second cavity therein between, a gas outlet in the second circular disc for withdrawing air from the second cavity, and sealing means positioned on top of the sidewalls for providing a substantially sealed second cavity when a wafer is positioned on top of the sidewalls.

10 Claims, 2 Drawing Sheets

APPARATUS AND METHOD FOR ETCHING WAFER BACKSIDE

FIELD OF THE INVENTION

The present invention generally relates to an apparatus for holding a wafer in a wet etch tank and a method for using, more particularly, relates to an apparatus for holding a wafer in a wet etch tank that does not require mechanical clamping for etching the wafer backside and a method for using the apparatus.

BACKGROUND OF THE INVENTION

Miniaturization of motors, actuators and similar machine parts is receiving increasing attention because of the new uses of these devices made possible because of their small size. Additionally, these devices can be manufactured in large quantities at low piece-part cost. Current designs of miniaturized machine parts can be categorized according to size or scale. Macroscopic machine parts have a length in the range of approximately 1 to 10 inches, and while microscopic machine parts, sometimes referred to as MEMS (Micro-Electro-Mechanical-Systems) have a length in the range of 0.01 to 1 inch.

In any event, existing miniaturized actuators and motors of both macroscopic or microscopic size are essentially replicas of larger motors, and thus include such component parts as windings, stators, gears, transmission links, etc. These miniaturized parts must be assembled with high precision in order to produce an operable device providing the desired function, e.g. movement of an electrically activated component that then mechanically engages other parts to induce motion. Depending upon the engagement configuration, this motion may be linear in any of several axes, rotary, circular, etc. Because of the number of complex parts that must be assembled with a high degree of precision, the yields of parts meeting target specifications and performance are relatively low using current manufacturing processes. These low yields in turn increase the cost of the parts. Accordingly, it would be desirable to provide a new form of actuator and related method for inducing movement of an object on a microscopic or macroscopic scale which eliminates the problems mentioned above.

The MEMS technology has recently been extended to the semiconductor fabrication industry. In the present state of the art, a semiconductor device is normally formed in a planar structure and therefore the process for fabricating the semiconductor device is generally a planar process. For instance, layers of different materials, i.e. such as insulating materials and metallic conducting materials, are deposited on top of one another and then features of the device are etched through the various layers. The planar fabrication process, while adequate in fabricating most semiconductor elements and devices, is not suitable for fabricating certain devices that are 3-dimensional in nature. For instance, a 3-D solenoid, i.e. or a 3-D inductor coil, must be fabricated by stacking a large number of layers from the bottom to the top and therefore, requires a large number of photomasks to complete the task. When CMOS technology is used in forming such 3-D solenoid, at least four other steps utilizing photomasks must be incorporated in order to complete the fabrication process. Moreover, the precise alignment between the layers is necessary in order to avoid a variety of processing difficulties occurring at the interfaces.

Another integration between the CMOS technology and the MEMS technology is the fabrication of a membrane device for a sensor utilized in an integrated circuit. The formation of the membrane requires the deposition of a silicon nitride film as a passivation layer on the backside of a wafer, the opening of holes by lithography for the membrane, and then wet etching in a caustic solution the wafer backside to form a thin film membrane having a thickness such as 25 $\mu$m. For instance, when a 25 $\mu$m thickness membrane is to be formed in a 4" wafer of 525 $\mu$m thickness, the wafer backside must be wet etched in a caustic solution of KOH at 30% concentration and 85° C. for a length of time as long as 6 hours. The etch rate of silicon in the KOH etchant is about 1.33 $\mu$m per minute.

Conventionally, a wafer is held in an apparatus shown in FIGS. 1A and 1B during the wet etch process. Due to the extended length of time, i.e. 6 hours, which is required to etch away the bulk of silicon to leave a thin film membrane, the conventional apparatus 10 utilizing mechanical clamping presents numerous problems. For instance, as shown in FIG. 1A, the clamping screws 12 cause localized stress in the wafer since only six clamping screws are normally used. The clamping stress imposed on the wafer frequently causes cracking or breakage of the wafer, even though O-ring type gaskets 14 are normally used. While the O-ring type gaskets 14 are utilized to alleviate stress concentration, and more importantly, to prevent leakage of the etchant solution to the front side 16 of the wafer 20, the seal provided by the O-ring gaskets 14 is not always effective considering the length of time that the wafer 20 must be immersed in the wet etchant.

FIG. 1A further illustrates six apertures 16 evenly distributed in the upper clamp ring 18 which engages the lower clamp ring 22 such that the backside 24 of the wafer 20 can be exposed to the wet etchant. The potential leakage of the etchant solution to attack the front side 16 of the wafer 20 and the potential breakage of the wafer lead to low yield of the wet etch process.

It is therefore an object of the present invention to provide a process integration for the CMOS process and the MEMS process for etching wafer backside without the drawbacks or shortcomings of the conventional method.

It is another object of the present invention to provide an apparatus for mounting a wafer and etching a wafer backside when the apparatus is immersed in an etchant solution.

It is a further object of the present invention to provide an apparatus for mounting a wafer and etching a wafer backside that does not require mechanical clamping and thus localized clamping stress is avoided.

It is another further object of the present invention to provide an apparatus for mounting a wafer and etching a wafer backside by utilizing a suction force for holding the wafer in the apparatus.

It is still another object of the present invention to provide an apparatus for mounting a wafer and etching a wafer backside by flowing air or inert gas into an outer chamber cavity and withdrawing air from an inner chamber cavity for holding down the wafer.

It is yet another object of the present invention to provide a method for mounting a wafer and etching a wafer backside without mechanical clamping and without wafer breakage problems.

SUMMARY OF THE INVENTION

In accordance with the present invention, an apparatus and a method for mounting a wafer and etching a wafer backside are provided.

In a preferred embodiment, an apparatus for mounting a wafer and etching a wafer backside is provided which includes a first circular disc that has a first sidewall integrally formed along a peripheral edge of the disc extending upwardly to a first height; a gas inlet in the first circular disc or in the first sidewall for flowing a gas through the gas inlet into a first cavity formed by the first circular disc, the first sidewall, a second circular disc and a second sidewall; a second circular disc that has a second sidewall integrally formed along a peripheral edge of the disc extending upwardly to a second height, the second circular disc has a diameter smaller than a diameter of the first circular disc by not more than 5 mm, the second sidewall has a height smaller than a height of the first sidewall by at least ½ of a thickness of the wafer; a third circular disc that has a third sidewall integrally formed along a peripheral edge of the disc extending upwardly to a third height, the third circular disc has a diameter smaller than a diameter of the second circular disc by at least 5 mm, the third sidewall has a top substantially leveled to a top of the second sidewall, the third circular disc is affixed to and supported by the second circular disc; a gas outlet in the second circular disc for allowing the withdrawal of a gas from a second cavity formed by the second circular disc, the second sidewall, the third circular disc, the third sidewall and the wafer positioned on top and supported by the second and third sidewalls; and sealing means positioned on top of the second and third sidewalls for providing a substantially vacuum-tight chamber in the second cavity when the wafer is positioned on top of the second and third sidewalls.

In the apparatus for mounting a wafer and etching a wafer backside, the first, second and third circular discs and the first, second and third sidewalls may be fabricated of stainless steel or teflon. The second circular disc may have a diameter smaller than a diameter of the first circular disc by an amount sufficient to stop an etchant solution from entering the first cavity when the apparatus is immersed in the etchant solution and when a gas is flown into the gas inlet. The sealing means may be elastomeric O-rings, or may be elastomeric gaskets. The first and second sidewalls may have a top edge equipped with a flat surface sufficiently large to engage the sealing means. The top edges of the first and second sidewalls are substantially in the same horizontal plane. The apparatus may further include fixing means for fixing the position of the second circular disc to the first circular disc, or an aspirator means in fluid communication with the gas outlet for withdrawing gas from the second cavity, or a gas supply means in fluid communication with the gas inlet for flowing a gas into the first cavity.

The present invention is further directed to a method for mounting a wafer and etching the wafer backside which can be carried out by the operating steps of first providing an apparatus that includes a first circular disc that has a first sidewall integrally formed along a peripheral edge of the disc extending upwardly to a first height; a gas inlet in the first circular disc or the first sidewall for flowing a gas through the gas inlet into a first cavity formed by the first circular disc, the first sidewall, a second circular disc and a second sidewall; a second circular disc that has a second sidewall integrally formed along a peripheral edge of the disc extending upwardly to a second height, the second circular disc has a diameter smaller than a diameter of the first circular disc by not more than 5 mm, the second sidewall has a height smaller than a height of the first sidewall by at least ½ of a thickness of the wafer; a third circular disc that has a third sidewall integrally formed along a peripheral edge of the disc extending upwardly to a third height, the third circular disc has a diameter smaller than a diameter of the second circular disc by at least 5 mm, the third sidewall has a top substantially leveled to a top of the second sidewall, the third circular disc being affixed to and supported by the second circular disc; a gas outlet in the second circular disc for allowing the withdrawal of air from a second cavity formed by the second circular disc, the second sidewall, the third circular disc, the third sidewall and the wafer positioned on top and supported by the second and third sidewalls; sealing means positioned on top of the second and third sidewalls for providing a substantially vacuum-tight chamber in the second cavity when the wafer is positioned on top of the second and third sidewalls; positioning the wafer on top of the second and third sidewalls; withdrawing air from the second cavity by an evacuation means; flowing air or inert gas into the first cavity forming a barrier to stop the etchant solution from entering the first cavity; immersing the apparatus in an etchant solution and etching a backside of the wafer.

The method for mounting a wafer and etching the wafer backside may further include the step of withdrawing air from the second cavity by an aspirator, or the step of flowing nitrogen into the first cavity forming a barrier to stop the etchant solution from entering the first cavity. The method may further include the step of providing the etchant solution in an etchant tank, or providing the etchant solution in an acid solution in a tank. The method may further include the step of providing the sealing means in an elastomeric gasket, or in an elastomeric O-ring. The method may further include the step of flowing air or inert gas into the first cavity at a pressure higher than a pressure for withdrawing air from the second cavity by the evacuation means, or the step of withdrawing air from the second cavity at a pressure higher than a liquid pressure of the etchant solution, or the step of supplying the wet etchant in KOH solution.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus and a method for mounting a wafer and etching a wafer backside when the apparatus is immersed in an etchant solution. The present invention apparatus and method presents greatly improved results over that of the conventional apparatus and method since no mechanical clamping is required and thus, any possible wafer breakage due to clamping stress is avoided. Moreover, the present invention novel apparatus and method presents a uniform sealing force on the wafer and thus an improved seal against leakage of etchant solution to the front side of the wafer.

The present invention wafer mounting apparatus is constructed essentially by a first circular disc with a first sidewall thereon, a gas inlet in the first disc or first sidewall, a second circular disc that has a second sidewall thereon for positioning inside the first circular disc, a third circular disc that has a third sidewall thereon for positioning inside the second circular disc, a gas outlet in the second circular disc for allowing withdrawal of air or formation of vacuum in a cavity formed between the second and third circular discs, and sealing means such as rubber O-rings on top of the second and third sidewalls.

Figure 1A:
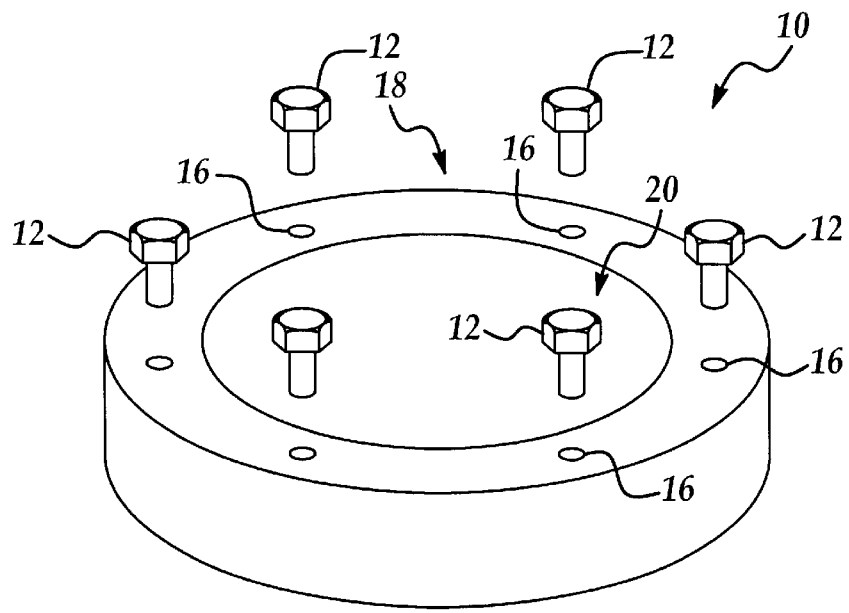
FIG. 1A is a perspective view of a conventional apparatus for mechanical clamping a wafer therein during a wet etch process.
Figure 1B:
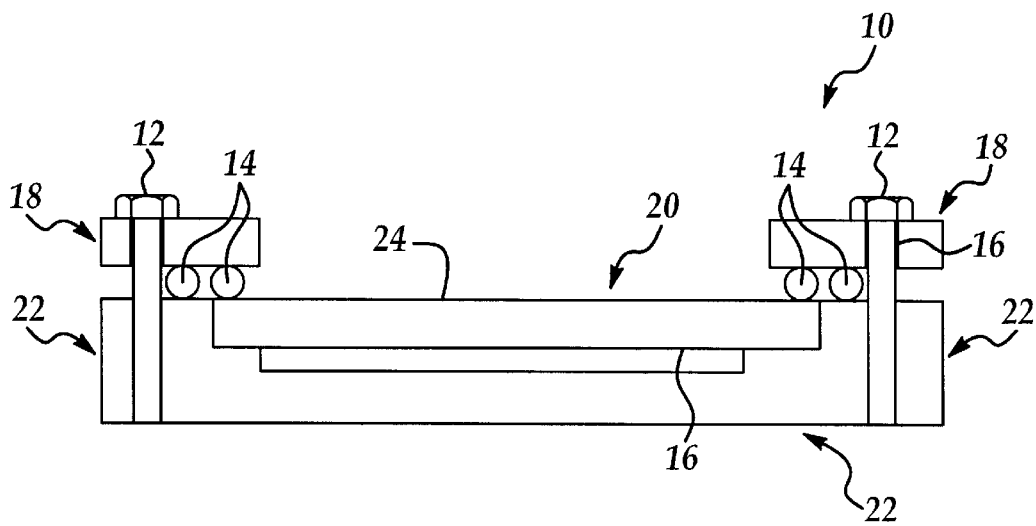
FIG. 1B is a cross-sectional view of the conventional apparatus shown in FIG. 1A.
Figure 2A:
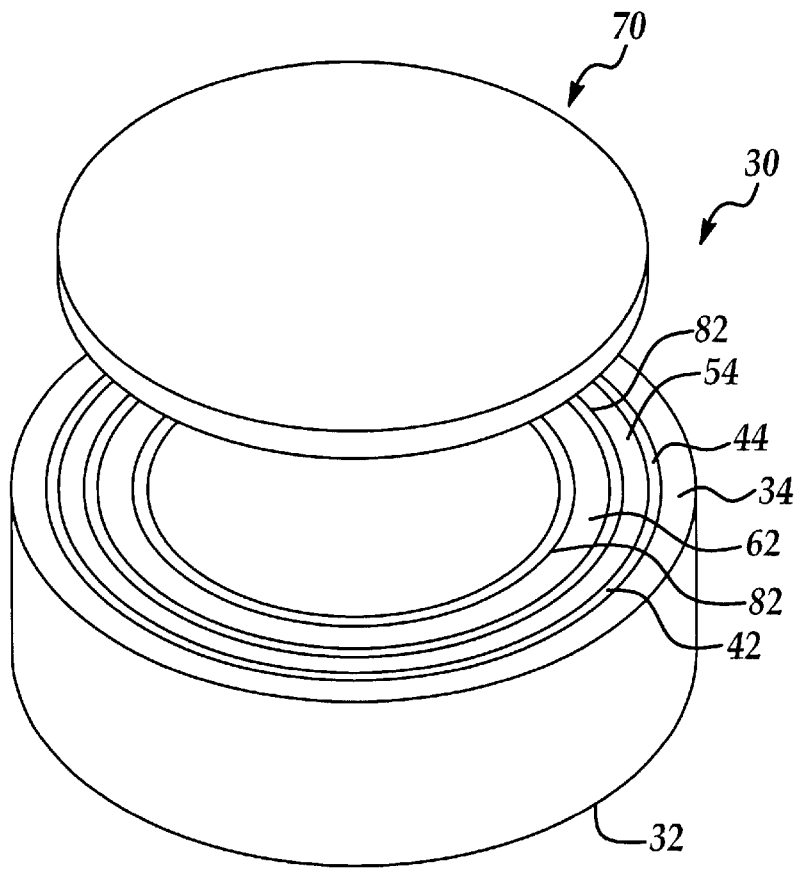
FIG. 2A is a perspective view of the present invention apparatus for mounting a wafer and etching a wafer backside.
Figure 2B:
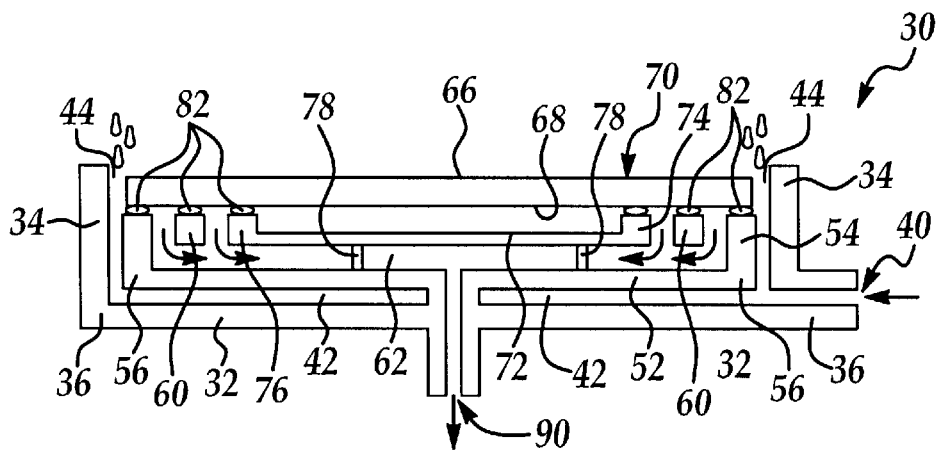
FIG. 2B is a cross-sectional view of the present invention apparatus shown in FIG. 2A.

Referring now to FIG. 2A, wherein a present invention apparatus 30 for mounting a wafer and etching a wafer backside is shown. A corresponding cross-sectional view of the apparatus 30 is shown in FIG. 2B. The present invention apparatus 30 is constructed by a first circular disc 32 that has a first sidewall 34 integrally formed along a peripheral edge 36 of the disc 32. The first sidewall 34 extends upwardly to a first height that is larger than the other sidewalls to be disclosed later. A gas inlet 40 is provided either in the first circular disc 32 of in the first sidewall 34 for flowing a gas through the gas inlet 40 into a first cavity 42 formed by the first circular disc 32, the first sidewall 34, a second circular disc 52, and a second sidewall 54. The second circular disc 54 which has the second sidewall 54 integrally formed along a peripheral edge 56 of the disc extending upwardly to a second height, which is smaller than the first height of the first sidewall 34 by at least ½ of a thickness of the wafer 70. The second circular disc 52 has a diameter that is smaller than a diameter of the first circular disc 32 by not more than 5 mm, or by a distance between about 0.5 mm and about 5 mm. When the distance is larger than 5 mm, the entrance of the etchant solution into the first cavity 42 may not be prevented even when a gas is flown into the first cavity 42.

The apparatus 30 further includes a third circular disc 72 which has a third sidewall 74 integrally formed along a peripheral edge 76 of the disc 72 and extends upwardly to a third height, which is smaller than the first and second height. The third circular disc 72 has a diameter smaller than a diameter of the second circular disc by at least 5 mm to allow a sufficiently large second cavity 62 to be formed between the second circular disc 52, the second sidewall 54, the third circular disc 72 and the third sidewall 74, and the sealing means 82 sealing against a front surface 68 of the wafer 70. The third sidewall 74 has a top substantially leveled to a top of the second sidewall such that sealing for the second cavity 62 against the front surface 68 of the wafer 70 can be made possible. The third circular disc 72 may be fixed to and supported by the second circular disc by anchor means 78.

A gas outlet 90 is provided in the second circular disc 52 for allowing the withdrawal of a gas from the second cavity 62. The withdrawal of gas or air from the second cavity 62 can be advantageously carried out by a device such as an aspirator (not shown) that is connected in fluid communication with the gas outlet 90.

The sealing means 82 may be elastomeric gaskets or elastomeric O-rings which have sufficient flexibility, and resiliency and chemical resistance to the etchant solution the apparatus 30 is immersed in. As shown in FIG. 2A, the outer diameter of the wafer 70 is the same as the outer diameter of the outermost O-ring 82.

The present invention also discloses a method for mounting a wafer and etching the wafer backside which can be described as follows. First, an apparatus 30 as described above is provided. A wafer 70 is then positioned on top of the second sidewall 54 and the third sidewall 74 with the backside 66 of the wafer 70 exposed. Air is then withdrawn from the second cavity 62 by the evacuation means, or the aspirator through gas outlet 90. After air or an inert gas, such as nitrogen, is flown into the first cavity 42 to form a gas barrier 44 to stop etchant solution from entering the first cavity 42. A suitable flow rate of air or inert gas into the gas inlet 40 is between about 1 sccm and about 100 sccm. During normal operations, a small flow of air or inert gas constantly exiting the gas barrier 44 thus exerting a positive pressure in the first cavity 42 such that any possible leakage of the etchant solution into the first cavity 42 can be prevented. A suitable flow rate of the air or gas can normally be obtained by trial and error until the small flow of gas is established and no leakage of the etchant solution occurs.

It should be noted that in FIG. 2B, an additional sidewall 60 is included to provide additional support for the wafer 70. The additional sidewall 60 may be mechanically fixed to the second sidewall 54 and/or the third sidewall 74. For simplicity reasons, the connection is not shown in FIG. 2B.

Under normal operations, the air or inert gas that enters the gas inlet 40 should have a pressure larger than the gas exiting the gas outlet 90 or larger than the pressure of the aspirator. The pressure of the aspirator, in turn, should be larger than the liquid pressure of the etchant solution when the apparatus 30 is immersed in the etch tank.

By utilizing the present invention novel apparatus 30, a more uniform sealing pressure is exerted on the wafer backside 68 and therefore, chances of wafer breakage is substantially reduced. Moreover, the lack of localized mechanical stress by clamping further improves the seal by the sealing means.

The present invention apparatus and method for mounting a wafer and etching the wafer backside have therefore been amply described in the above description and in the appended drawings of FIGS. 2A and 2B.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. An apparatus for mounting a wafer and etching a wafer backside comprising:
   a first circular disc having a first sidewall integrally formed along a peripheral edge of the disc extending upwardly to a first height;
   a gas inlet in said first circular disc or said first sidewall for flowing a gas through said gas inlet into a first cavity formed by said first circular disc, said first sidewall, a second circular disc and a second sidewall;
   a second circular disc having a second sidewall integrally formed along a peripheral edge of the disc extending upwardly to a second height, said second circular disc having a diameter smaller than a diameter of said first circular disc by not more than 5 mm, said second sidewall having a height smaller than a height of said first sidewall by at least ½ of a thickness of said wafer;
   a third circular disc having a third sidewall integrally formed along a peripheral edge of the disc extending upwardly to a third height, said third circular disc having a diameter smaller than a diameter of said second circular disc by at least 5 mm, said third sidewall having a top substantially leveled to a top of said second sidewall, said third circular disc being affixed to and supported by said second circular disc;

a gas outlet in said second circular disc for allowing the withdrawal of a gas from a second cavity formed by said second circular disc, said second sidewall, said third circular disc, said third sidewall and said wafer positioned on top and supported by said second and third sidewalls; and sealing means positioned on top of said second and third sidewalls for providing a substantially vacuum-tight chamber in said second cavity when said wafer is positioned on top of said second and third sidewalls.

2. An apparatus for mounting a wafer and etching a wafer backside according to claim 1, wherein said first, second and third circular discs and said first, second and third sidewalls are fabricated of stainless steel.

3. An apparatus for mounting a wafer and etching a wafer backside according to claim 1, wherein said second circular disc having a diameter smaller than a diameter of said first circular disc by an amount sufficient to stop a etchant solution from entering said first cavity when said apparatus is immersed in said etchant solution and when a gas is flown into said gas inlet.

4. An apparatus for mounting a wafer and etching a wafer backside according to claim 1, wherein said sealing means being elastomeric O-rings.

5. An apparatus for mounting a wafer and etching a wafer backside according to claim 1, wherein said sealing means being elastomeric gaskets.

6. An apparatus for mounting a wafer and etching a wafer backside according to claim 1, wherein said first and second sidewalls having a top edge equipped with a flat surface sufficiently large to engage said sealing means.

7. An apparatus for mounting a wafer and etching a wafer backside according to claim 6, wherein said top edges of said first and second sidewalls are substantially in the same horizontal plane.

8. An apparatus for mounting a wafer and etching a wafer backside according to claim 1 further comprising means for fixing the position of said second circular disc to said first circular disc.

9. An apparatus for mounting a wafer and etching a wafer backside according to claim 1 further comprising an aspirator means in fluid communication with said gas outlet for withdrawing gas from said second cavity.

10. An apparatus for mounting a wafer and etching a wafer backside according to claim 1 further comprising a gas supply means in fluid communication with said gas inlet for flowing a gas into said first cavity.

* * * * *